(12) United States Patent
Hattori et al.

(10) Patent No.: US 9,148,964 B2
(45) Date of Patent: Sep. 29, 2015

(54) ELECTRICAL JUNCTION BOX

(71) Applicant: Sumitomo Wiring Systems, Ltd., Yokkaichi, Mie (JP)

(72) Inventors: Yuuichi Hattori, Yokkaichi (JP); Akihiro Oda, Yokkaichi (JP)

(73) Assignee: Sumitomo Wiring Systems, Ltd. (JP)

( * ) Notice: Subject to any disclaimer, the term of this patent is extended or adjusted under 35 U.S.C. 154(b) by 322 days.

(21) Appl. No.: 13/889,578

(22) Filed: May 8, 2013

(65) Prior Publication Data

US 2013/0343030 A1    Dec. 26, 2013

(30) Foreign Application Priority Data

Jun. 20, 2012 (JP) ................. 2012-138891

(51) Int. Cl.
*H05K 5/00* (2006.01)
*B60R 16/023* (2006.01)
*H01H 85/20* (2006.01)

(52) U.S. Cl.
CPC .......... *H05K 5/0004* (2013.01); *B60R 16/0238* (2013.01); *H01H 2085/208* (2013.01); *H01H 2085/2075* (2013.01)

(58) Field of Classification Search
CPC ................ H01H 2085/2075; H01H 2085/208; H05K 5/0004; B60R 16/0238
USPC ................................................ 361/833, 834
See application file for complete search history.

(56) References Cited

U.S. PATENT DOCUMENTS

| | | | | |
|---|---|---|---|---|
| 5,785,532 | A * | 7/1998 | Maue et al. | 439/34 |
| 6,350,949 | B1 * | 2/2002 | Boyd | 174/50.5 |
| 6,707,689 | B2 * | 3/2004 | Momota et al. | 361/833 |
| 6,905,346 | B2 * | 6/2005 | Momota et al. | 439/76.2 |
| 7,927,111 | B2 * | 4/2011 | Kita | 439/76.2 |
| 8,297,988 | B2 * | 10/2012 | Sugiura et al. | 439/76.2 |
| 2002/0080562 | A1 * | 6/2002 | Nakamura et al. | 361/626 |
| 2003/0022536 | A1 * | 1/2003 | Saito et al. | 439/76.2 |
| 2005/0087355 | A1 * | 4/2005 | Ikeda et al. | 174/50 |
| 2005/0221641 | A1 * | 10/2005 | Saka | 439/76.2 |
| 2009/0163085 | A1 * | 6/2009 | Makino et al. | 439/701 |
| 2009/0269951 | A1 * | 10/2009 | Scheele et al. | 439/76.2 |

FOREIGN PATENT DOCUMENTS

JP    2008-053079    3/2008

* cited by examiner

*Primary Examiner* — Ramon Barrera
(74) *Attorney, Agent, or Firm* — Gerald E. Hespos; Michael J. Porco; Matthew T. Hespos

(57) ABSTRACT

An electrical junction box has a fuse module (40) with a plurality of fuse attachment portions (102) open into a first side face (132) and arranged side by side in a plurality of tiers that are placed one above another. A plurality of connector attachment portions (128) and (130) in which respective input terminals (90) and (96) of the fuse module (40) are disposed are provided so as to open into a second side face (134) that is perpendicular to the first side face (132), and are disposed in mutually shifted positions in a direction in which the tiers of the fuse attachment portions (102) are placed one above another.

8 Claims, 9 Drawing Sheets

ELECTRICAL JUNCTION BOX

BACKGROUND

1. Field of the Invention

The invention relates to an electrical junction box for an automobile or the like, and particularly relates to an electrical junction box in which a plurality of connector attachment portions to be connected to respective connectors open to a lateral side of a box body.

2. Description of the Related Art

Electrical junction boxes, such as junction boxes in automobiles and the like, are equipped with a large number of fuse attachment portions to which fuses are attached for preventing an overcurrent from flowing to various electrical components. JP 2008-53079A discloses an electrical junction box equipped with a fuse module in which fuse attachment portions open into a side face of a box body and are arranged side by side in a plurality of tiers placed one above another to enable a large number of fuses to be connected with high space efficiency. A connector attachment portion is open into a side face of the box body and is connected to a connector from a battery or the like to supply power to input terminal in the fuse attachment portions.

Power for electrical components in automobiles can be supplied from batteries or alternators. A connector attachment portion for a battery and a connector attachment portion for an alternator are required if it is necessary to enable power supplies from both a battery and from an alternator to an electrical junction box.

Wires extending from connectors must be bent when plural connector attachment portions are arranged side by side in a side face of a box body. The wires overlap each other, and much time and effort is required to perform routing. Wires for input power sources that are connected to batteries, alternators, and the like are often thick and require a large bend radius. Accordingly, the wires protrude a large distance from the box body and a layout space of the electrical junction box is large when the wires are taken into account.

The invention was made in view of the above-described circumstances, and it is an object thereof to provide an electrical junction box having a novel structure that enables a plurality of connector attachment portions to be disposed in a side face of a box body with high space efficiency and that can suppress the distance by which a wire extending from a connector protrudes from the box body.

SUMMARY OF THE INVENTION

The invention relates to an electrical junction box that has a fuse module with fuse attachment portions that open into a first side face of a box body. The fuse attachment portions are arranged side by side in a plurality of tiers one above another. Connector attachment portions open into a second side face of the box body that is perpendicular to the first side face have input terminals of the fuse module. The connector attachment portions in the second side face are disposed in mutually shifted positions in a direction in which the tiers of fuse attachment portions are placed one above another. Thus, overlapping of the wires can be reduced even if a plurality of wires extending from connectors attached to the connector attachment portions are bent in the same direction. Therefore, the bend radius of the wires extending from the connectors can be smaller and the distance by which each wire protrudes from the box body can be reduced, so that the layout space of the electrical junction box including the wires can be reduced. In addition, it is possible to dispose the plurality of connector attachment portions in positions that are shifted in the vertical direction without leading to an increase in the dimension of the electrical junction box in the vertical direction by efficiently using the height of the fuse module in the vertical direction in which the tiers of the fuse attachment portions are placed one above another.

The connector attachment portions may partially overlap in the vertical direction, but preferably are disposed at a distance from each other in the vertical direction without overlapping. In this manner, overlapping of the wires can be avoided more effectively when the wires extending from the connector attachment portions are bent, and the bend radius of each wire can be reduced even more. Thus, the dimensions of the electrical junction box, including the wires, can be decreased even more.

The connector attachment portions preferably are spaced from each other in the direction in which the tiers of the fuse attachment portions are placed one above another. Thus, the connector attachment portions are shifted in a direction in which the second side face extends. L-shaped connectors are connected to at least the connector attachment portions that are on the innermost side of the box body in the direction in which the second side face extends. Thus, a vacant space with no connector attachment portions is formed next to at least the connector attachment portion that on the innermost side in the direction in which the second side face extends. The L-shaped connectors use this vacant space to suppress the protruding distance of the L-shaped connector from the box body. Furthermore, the L-shaped connector enables the direction in which the wire extends to be changed without bending the wire, thereby further reducing the distance by which the wire protrudes from the box body. Moreover, the non-overlapping disposition of the connector attachment portions as seen in the direction in which the tiers of the fuse attachment portions are placed one above another, enables the attachment state of the connectors to the respective connector attachment portions to be checked visually from above.

An opening window preferably is formed under the connector attachment portion that is disposed on an upper side in the direction in which the tiers of the fuse attachment portions are placed one above another.

The fuse attachment portions are arranged side by side in the fuse module and connecting terminals are provided the fuse attachment portions. Thus, the connecting terminals are arranged side by side and are soldered to a printed circuit board or the like within the electrical junction box. The soldered state of the connecting terminals can be checked visually from the side of the first side face into which the fuse attachment portions open because it is possible to see in a direction that is perpendicular to the direction in which the side by side connecting terminals are arranged. However, a cavity for accommodating a fuse is provided in each fuse attachment portion and the soldering portions of the connecting terminals are concealed by the structure that forms the cavity. Therefore, the soldering portions cannot be observed easily from the side of the first side face. To address this issue, the opening window is formed in the second side face that is perpendicular to the first side face by efficiently using the vacant space under a connector attachment portion. Thus, the soldered state of the large number of connecting terminals can be checked visually through the opening window.

DETAILED DESCRIPTION OF THE PREFERRED EMBODIMENTS

Figure 1:
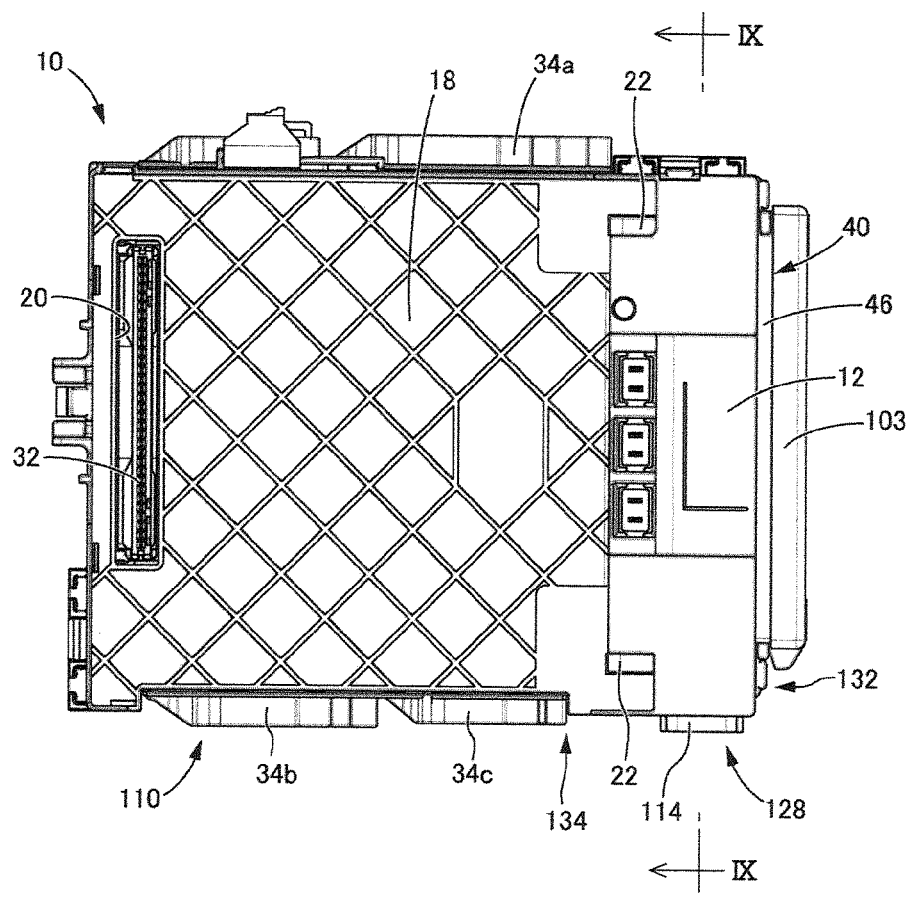
FIG. 1 is a plan view of an electrical junction box serving of an embodiment of the invention.

FIGS. 1 to 4 show an electrical junction box 10 in accordance with the invention. As is clear from FIG. 4, the electrical junction box 10 has a printed circuit board 16 that constitutes an internal circuit accommodated between an upper case 12 and a lower case 14. In the following description, "upper side" refers to the upper side in FIG. 2, and "lower side" refers to the lower side in FIG. 2.

The upper case 12 is molded unitarily of synthetic resin and has a substantially rectangular box-like shape that opens down. An attachment surface 18 is formed at an upper face of the upper case 12, and a connector insertion hole 20 penetrates the attachment surface 18 at one end of the upper case 12. Bearings 22 are provided outside the attachment surface 18 on the side opposite the connector insertion hole 20.

The lower case 14 is molded unitarily of synthetic resin and has a substantially rectangular box-like shape that opens up. The lower case 14 includes a bottom wall 24 with a substantially rectangular plate-like shape and a peripheral wall 26 extending up from an outer periphery of the bottom wall 24.

The printed circuit board 16 has a rectangular plate-like shape and electrical components, such as relays 28, are provided appropriately on a central portion of the printed circuit board 16. An elongate connector 32 for external connection extends up at an outer peripheral portion 30a at one side of the printed circuit board 16 and has a long direction parallel to the outer peripheral portion 30a. A lateral connection type connector 34a is disposed at an outer peripheral portion 30b along a side that is perpendicular to the outer peripheral portion 30a. The lateral connection type connector 34a has a connector accommodating member 36 formed of synthetic resin and open to a lateral side of the electrical junction box 10. L-shaped connecting terminals 38 are inserted into the connector accommodating member 36. One end of each connecting terminal 38 protrudes out from the connector accommodating member 36 to the side of the printed circuit board 16, while the other end extends toward the printed circuit board 16 and is soldered into connection with the printed circuit board 16.

Figure 5:
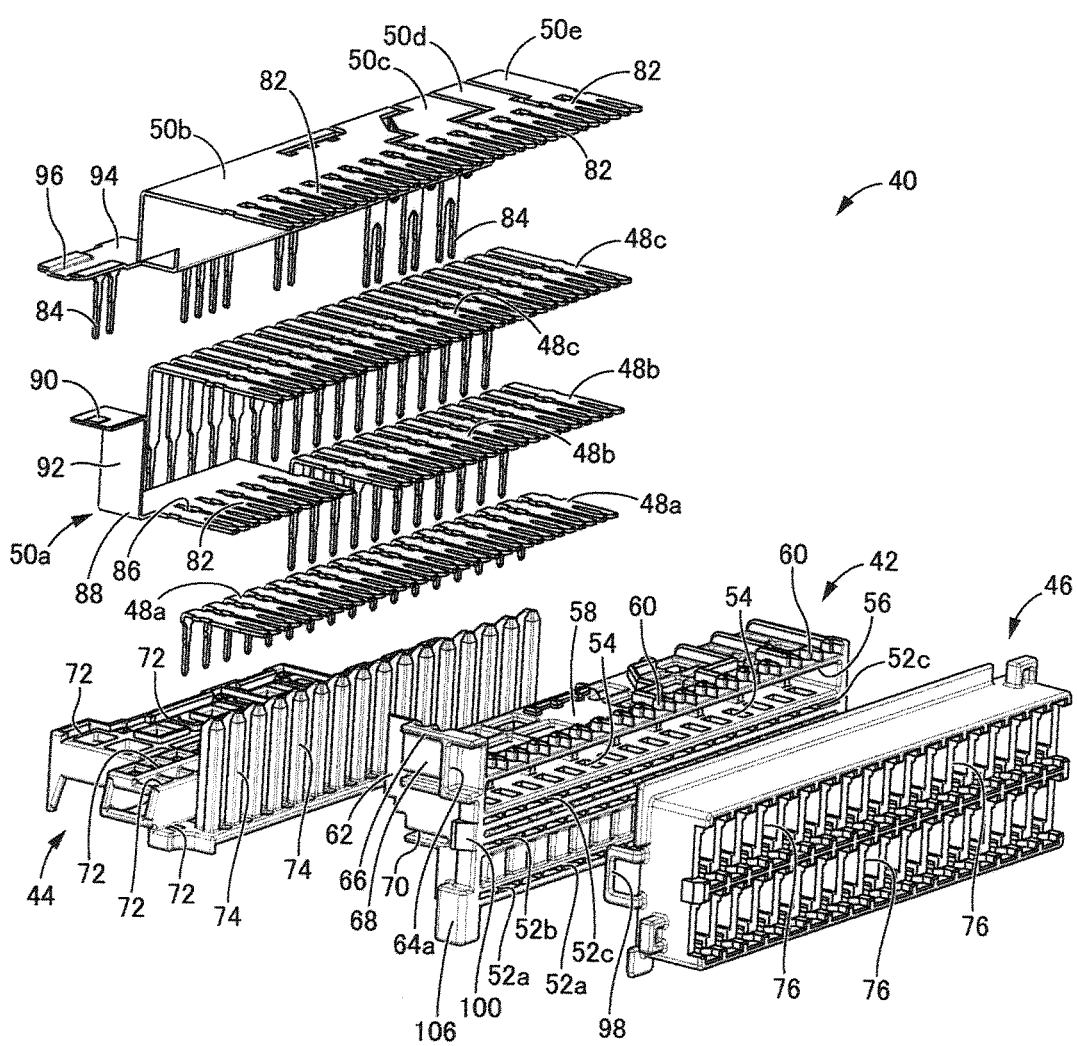
FIG. 5 is an exploded perspective view of a fuse module.
Figure 6:
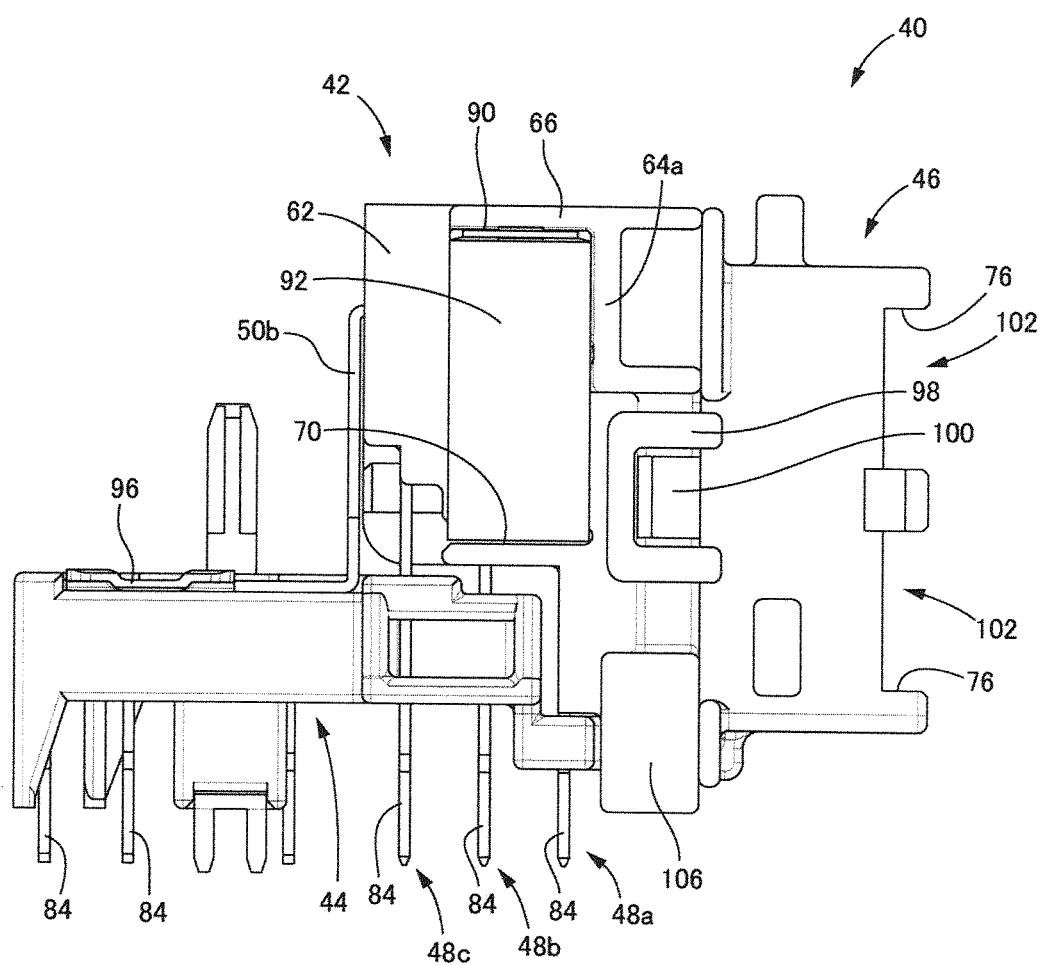
FIG. 6 is a side view of the fuse module.

A fuse module 40 is provided at an outer peripheral portion 30c on a side of the printed circuit board 16 opposite the connector 32 for external connection. As shown in FIGS. 5 and 6, the fuse module 40 includes a terminal holding block 42, a base 44, a fuse case 46, board terminals 48a to 48c, and busbars 50a to 50e.

The terminal holding block 42 is molded unitarily of synthetic resin and has a substantially elongated block-like shape. Terminal insertion holes 52a to 52c penetrate the terminal holding block 42 in a front-rear direction (left-right direction in FIG. 6) and are arranged side by side in a longitudinal direction of the terminal holding block 42. The terminal insertion holes 52a to 52c are arranged in three vertically spaced tiers. The terminal insertion holes 52a in the lowermost tier are arranged side by side and are vertically opposed respectively to the terminal insertion holes 52b in the middle tier with a space between the opposed terminal insertion holes 52a, 52b corresponding to a distance between a pair of connecting terminals of a fuse, which is not shown. The terminal insertion holes 52c are arranged side by side above the terminal insertion holes 52b. Pin insertion holes 54 extend vertically through the terminal holding block 42 at positions between horizontally adjacent terminal insertion holes 52a, 52b, 52c in each tier. An empty space 56 is formed above the terminal insertion holes 52c and opens forward (right in FIG. 6). The empty space 56 has an elongated rectangular shape extending in the longitudinal direction of the terminal holding block 42, and upper ends of the pin insertion holes 54 open into the empty space 56. The pin insertion holes 54 are formed at predetermined intervals in the longitudinal direction of the terminal holding block 42. Support projections 60 are formed on a front (right in FIG. 6) end edge of an upper face 58 of the terminal holding block 42 and are arranged at predetermined intervals in the longitudinal direction of the terminal holding block 42.

A lateral support rib 64a protrudes from one side face 62 of the terminal holding block 42 and extends vertically at a position slightly toward the front of the terminal holding block 42. An upper support rib 66 extends horizontally along the upper edge of the side face 62 at the upper end of the lateral support rib 64a. The upper support rib 66 and the lateral support rib 64a protrude equal distances from the side face 62. A support 68 is formed in a region bounded by the lateral and upper support ribs 64a and 66, but has a smaller protruding distance. An insertion slit 70 is formed in the terminal holding block 42 below the lateral support rib 64a. The insertion slit 70 extends in the front-rear direction (left-right direction in FIG. 6) of the terminal holding block 42 and opens to the rear of the terminal holding block 42. The lateral support rib 64a is more forward than the insertion slit 70, as shown in FIG. 6.

The base 44 is molded unitarily of synthetic resin and has a substantially rectangular plate-like shape with a longitudinal dimension substantially equal to the longitudinal dimension of the terminal holding block 42. Terminal insertion holes 72 penetrate the base 44 in the vertical direction. Furthermore, support pins 74 protrude up near a front (right in FIG. 6) edge of the base 44 at predetermined intervals in the longitudinal direction of the base 44 and at positions corresponding to the pin insertion holes 54 of the terminal holding block 42.

The fuse case 46 is molded unitarily of synthetic resin and has an elongated shape. Fuse accommodating portions 76 are formed in two vertically spaced tiers in the fuse case 46 and are arranged side by side in the longitudinal direction of the fuse case 46 in each tier. Each fuse accommodating portion 76 is a substantially rectangular recess that opens to the front side (right in FIG. 6) of the fuse case 46, and terminal insertion holes (not shown) are formed in upper and lower ends thereof.

Figure 7:
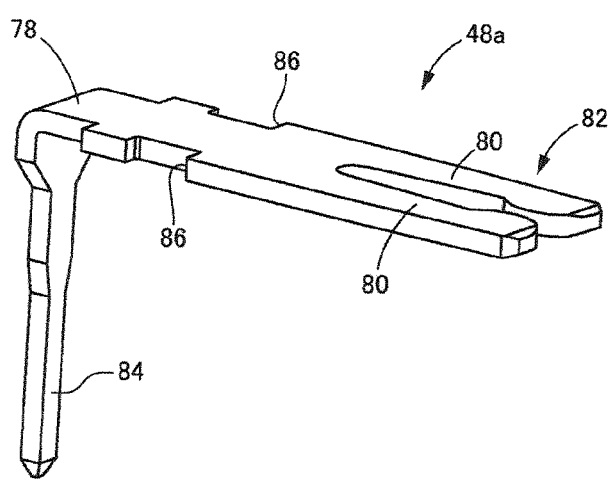
FIG. 7 is a perspective view of a board terminal constituting the fuse module.

All of the board terminals 48a to 48c have substantially the same shape. As shown in FIG. 7 the board terminal 48a, as an example, is formed by punching a metal plate to define an L-shape with a right angle bend 78. Opposed pressure-contact blades 80 are formed at one end of each board terminal 48a to 48c to define a connecting portion 82 that sandwiches a connecting terminal of a fuse (not shown). A soldering portion 84 is at the other end and is inserted into and soldered to a through hole of the printed circuit board 16. Locking notches 86 are formed in opposite widthwise edges between the connecting portion 82 and the bend 78. The distance from the bend 78 to the soldering portion 84 differs among the board terminals 48a, 48b, and 48c, and gradually increases from the board terminals 48a to the board terminals 48b, and to the board terminals 48c.

The busbars 50a to 50e are formed by punching a metal plate to define connecting portions 82 and locking notches 86 similar to those of the board terminals 48a to 48c extend along one edge. The busbars 50a to 50e are arranged side by side.

The busbar 50a has a flat plate-like shape with an edge 88 perpendicular to the edge along which the connecting portions 82 are arranged side by side. A first input terminal 90 protrudes from the edge 88 and has an upward extending portion 92 and an outwardly protruding tab, thereby defining a crank shape. The outwardly protruding tab of the first input terminal 90 is located above the connecting portions 82 of the busbar 50a.

The busbars 50b to 50e each have a crank shape and soldering portions 84 similar to those of the board terminals 48a to 48c are formed in an end edge opposite the edge with the connecting portions 82. A second input terminal 96 is formed unitarily at an end edge 94 of the busbar 50b and on a part of the crank shape remote from the connecting portions 82 and on the same side as the first input terminal 90 of the busbar 50a. The second input terminal 96 has a substantially flat tab that protrudes in the same direction as the first input terminal 90.

The fuse module 40 is assembled by inserting the connecting portions 82 of the board terminals 48a to 48c into the respective terminal insertion holes 52a to 52c of the terminal holding block 42 from the rear (left side in FIG. 6) to protrude forward from the terminal holding block 42. The connecting portions 82 of the busbar 50a are arranged side by side in the same row as the connecting portions 82 of the board terminals 48b and are inserted into some of the terminal insertion holes 52b in the same manner as the board terminals 48b to protrude forward from the terminal holding block 42. Furthermore, as shown in FIG. 6, the busbar 50a is inserted into the insertion slit 70 from the rear of the terminal holding block 42. Thus, the upward extending portion 92 of the first input terminal 90 is disposed on the side face 62 with an upper part of the upward extending portion 92 disposed on the support 68 and fit between the lateral support rib 64a and the upper support rib 66. The free end of the first input terminal 90 protrudes out from the terminal holding block 42 in the longitudinal direction.

The terminal holding block 42 to which the board terminals 48a to 48c and the busbars 50a have been mounted then is laid on the base 44, and the support pins 74 of the base 44 advance through the corresponding pin insertion holes 54 of the terminal holding block 42. Thus, the support pins 74 are inserted between the locking notches 86 of adjacent board terminals 48a, adjacent board terminals 48b (or the busbar 50a), and adjacent board terminals 48c. The engagement of the support pins 74 with the locking notches 86 of the board terminals 48a to 48c and the busbar 50a prevent the board terminals 48a to 48c and the busbar 50a from being detached inadvertently from the terminal holding block 42 and support the connecting portions 82 of the board terminals 48a to 48c and the busbar 50a during insertion/removal of fuses. Moreover, the soldering portions 84 of the board terminals 48a to 48c are inserted into the respective terminal insertion holes 72 of the base 44 and protrude down from the base 44.

The busbars 50b to 50e then are laid on the upper face 58 of the terminal holding block 42 and an upper face of the base 44. Thus, the support projections 60 formed on the upper face 58 of the terminal holding block 42 are inserted between adjacent locking notches 86 of the busbars 50b to 50e. As a result, the engagement of the locking notches 86 of the busbars 50b to 50e with the support projections 60 support the connecting portions 82 of the busbars 50b to 50e during insertion/removal of a fuse. Moreover, the soldering portions 84 of the busbars 50b to 50e protrude down through the terminal insertion holes 72 of the base 44. Furthermore, the second input terminal 96 protrudes laterally from the base 44. As is clear from FIG. 6, the second input terminal 96 is disposed below (below in FIG. 6) the first input terminal 90 and rearward of the first input terminal 90 in the front-rear direction of the fuse module 40 (the right side in FIG. 6 corresponds to the front, and the left side to the rear).

Figure 4:
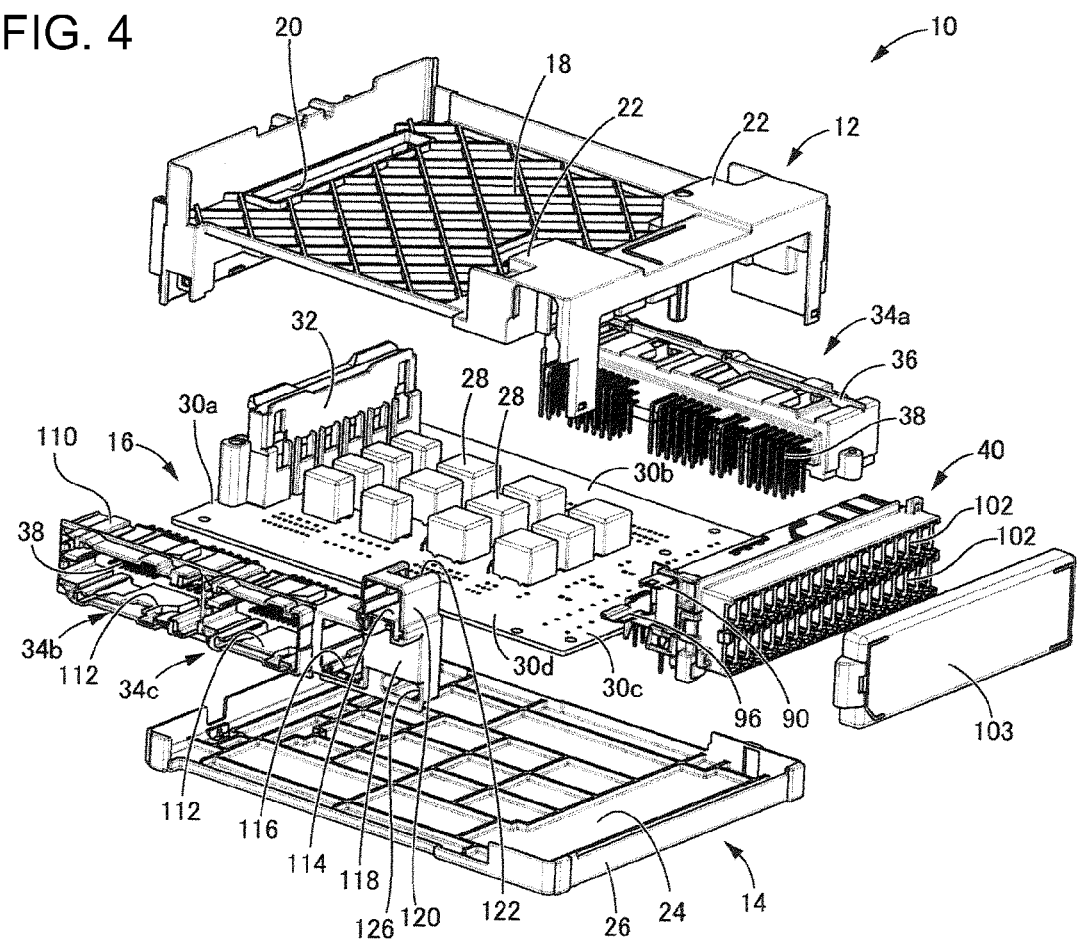
FIG. 4 is an exploded perspective view of the electrical junction box shown in FIG. 1.

The fuse case 46 is laid on a front face of the terminal holding block 42, and engagement frames 98 at opposite longitudinal ends of the fuse case 46 are engaged with engagement claws 100 at opposite longitudinal ends of the terminal holding block 42. The connecting portions 82 on the board terminals 48a and 48b and on the busbar 50a protrude forward from the terminal holding block 42 and are inserted into terminal insertion holes (not shown) of the fuse accommodating portions 76 in the lower tier. As a result, the connecting portions 82 of the board terminals 48a are opposed respectively to a corresponding connecting portion 82 of the board terminals 48b or the busbar 50a within each of the fuse accommodating portions 76. Similarly, the connecting portions 82 of the board terminals 48c and the connecting portions 82 of the busbars 50b to 50e are inserted into the fuse accommodating portions 76 in the upper tier and are located in opposing positions. A fuse attachment portion 102 is formed from a fuse accommodating portion 76 and two connecting portions 82 disposed therein. The fuse attachment portions 102 are arranged in two vertically spaced tiers, and the fuse attachment portions 102 in each tier are arranged side by side in the longitudinal direction of the fuse module 40. As shown in FIG. 4, a cover 103 can be mounted to the fuse module 40 to cover the openings of the fuse attachment portions 102 and protecting the connecting portions 82 therein.

As shown in FIG. 4, the above-described fuse module 40 is placed on the outer peripheral portion 30c of the printed circuit board 16, and the soldering portions 84 of the board terminals 48a to 48c and the bus bars 50b to 50e are inserted into and soldered to the respective through holes of the printed circuit board 16. Bolt fixing portions 106 formed at opposite longitudinal ends of the terminal holding block 42 then are fixed to the printed circuit board 16 with respective bolts 108 (see FIG. 9) to fix the fuse module 40 to the outer peripheral portion 30c of the printed circuit board 16.

A side wall 110 is disposed at one outer peripheral portion 30d of the printed circuit board 16 that extends perpendicular to the longitudinal direction of the fuse module 40. The side wall 110 is molded unitarily of synthetic resin and has an elongated shape. Two longitudinally adjacent connector accommodating portions 112 are formed in the side wall 110 and define rectangular recesses that open to an outer side of the printed circuit board 16. L-shaped connecting terminals 38 are inserted into the connector accommodating portions 112 to define lateral connection type connectors 34b and 34c similar to the lateral connection type connector 34a described above.

Figure 8:
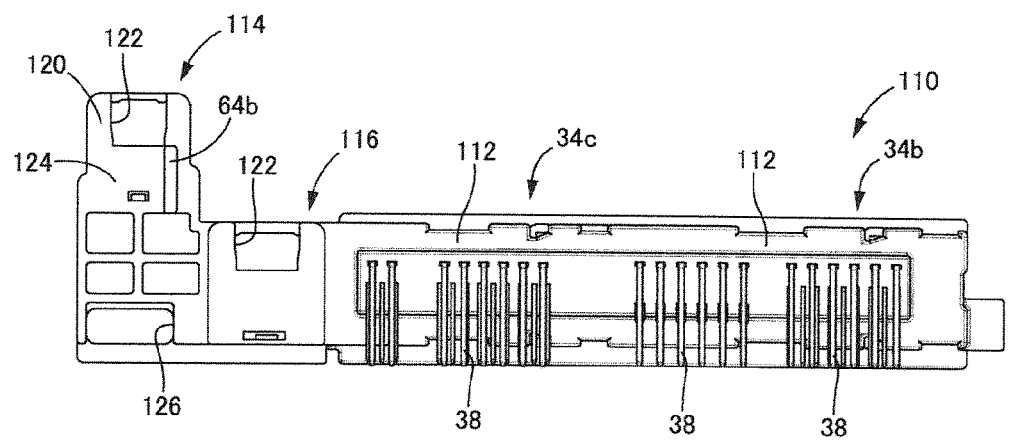
FIG. 8 is a back view of a side wall member.

First and second connector accommodating portions 114 and 116 are formed at a longitudinal end of the side wall 110 near the fuse module 40. The first and second connector accommodating portions 114 and 116 define empty spaces that open to the outer side of the printed circuit board 16. The first connector accommodating portion 114 is formed inside a substantially rectangular hood 120 that extends from a side face 118 of the side wall 110 to the outer side of the printed circuit board 16. On the other hand, the second connector accommodating portion 116 is a recess that opens into the side face 118 of the side wall 110. Thus, an opening end of the first connector accommodating portion 114 protrudes and is located farther out from the printed circuit board 16 than an opening end of the second connector accommodating portion 116. As shown in FIG. 8, the first and second connector accommodating portions 114 and 116 pass through the side wall 110 from the inner side of the printed circuit board 16 toward the outer side through respective terminal insertion openings 122 that penetrate through the side wall 110. The terminal insertion openings 122 extend continuously even to the upper side of the first and second connector accommodating portions 114 and 116, respectively, and the first and second connector accommodating portions 114 and 116 also open up through the respective terminal insertion openings 122.

The first and second connector accommodating portions 114 and 116 are shifted from each other in the vertical direction, with the first connector accommodating portion 114 being higher than the second connector accommodating portion 116. Furthermore, the first and second connector accommodating portions 114 and 116 are shifted from each other in the left-right direction in FIG. 8, which corresponds to the longitudinal direction of the side wall 110 so that the second connector accommodating portion 116 is farther on the inner side of the side wall 110 than the first connector accommodating portion 114 in the longitudinal direction of the side wall 110. Thus, the first and second connector accommodating portions 114 and 116 do not overlap and are spaced apart from each other in both of the vertical direction and the left-right direction.

A lateral support rib 64b protrudes unitarily from a back face 124 of the side wall 110, which is on the side of the printed circuit board 16. The lateral support rib 64b extends down from a lower edge of the terminal insertion opening 122 of the first connector accommodating portion 114 and is disposed on the inner side of the side wall 110 with respect to this terminal insertion opening 122 in the longitudinal direction of the side wall 110.

An opening window 126 penetrates the side wall 110 under the first connector accommodating portion 114. The opening window 126 is a through hole that has a substantially elongated rectangular shape extending in the longitudinal direction of the side wall 110, and is formed in a lower end portion of the side wall 110. An opening end face of the opening window 126 is recessed slightly farther back toward the printed circuit board 16 than the side face 118 that constitutes an opening end of the second connector accommodating portion 116.

Figure 2:
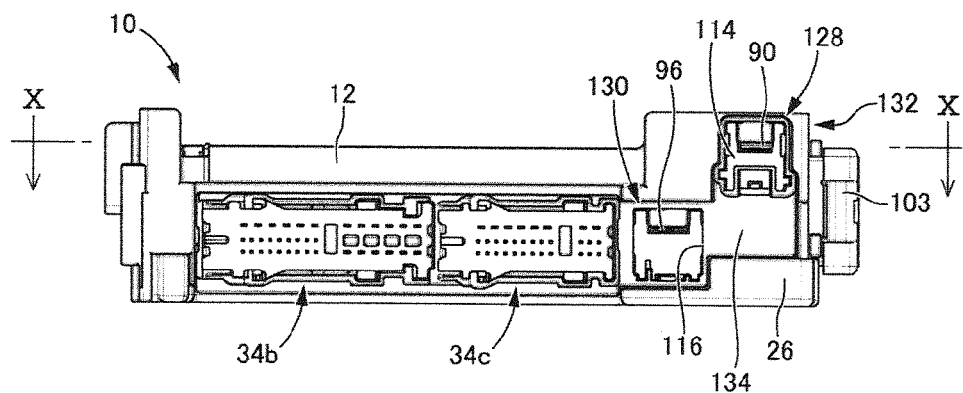
FIG. 2 is a side view of the electrical junction box shown in FIG. 1.

The side wall 110 is laid on the outer peripheral portion 30d of the printed circuit board 16, and the connecting terminals 38 of the lateral connection type connectors 34b and 34c in the side wall 110 are inserted into and soldered to through holes of the printed circuit board 16. Thus, the side wall 110 is disposed along the outer peripheral portion 30d of the printed circuit board 16. The side wall 110 is mounted to the printed circuit board 16 before the fuse module 40. The fuse module 40 then is laid on the outer peripheral portion 30c of the printed circuit board 16 from above the side wall 110, so that the first and second input terminals 90 and 96 that protrude from the fuse module 40, are inserted from above into the respective terminal insertion openings 122 of the first and second connector accommodating portions 114 and 116 and are disposed respectively within the first and second connector accommodating portions 114 and 116. Thus, as shown in FIG. 2, a first connector attachment portion 128 is formed by the first input terminal 90 and the first connector accommodating portion 114, and a second connector attachment portion 130 is formed by the second input terminal 96 and the second connector accommodating portion 116.

Figure 9:
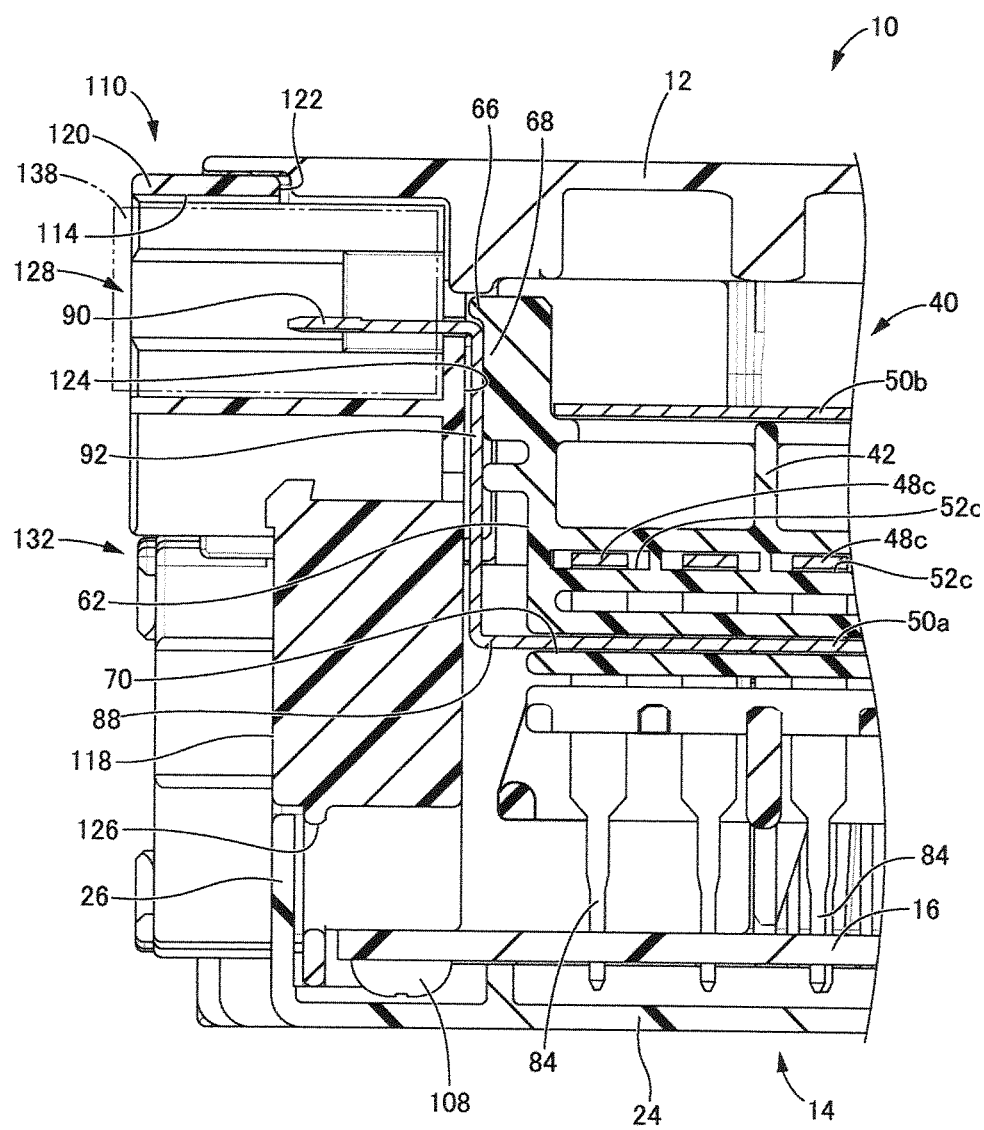
FIG. 9 is an enlarged view of a portion of cross section IX-IX in FIG. 1.
Figure 10:
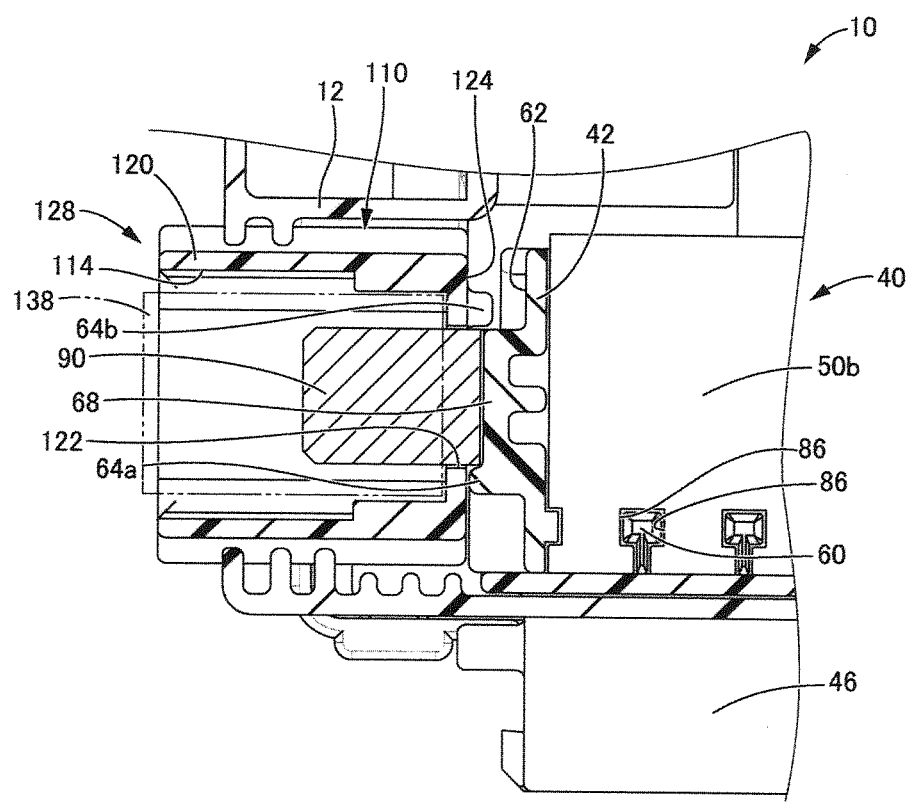
FIG. 10 is an enlarged view of a portion of cross-section X-X in FIG. 2.

As shown in FIG. 9, the back face 124 of the side wall 110 faces the upward extending portion 92 of the first input terminal 90, which protrudes laterally from the fuse module 40. Thus, the upward extending portion 92 is sandwiched by the back face 124 of the side wall 110 and the support 68 on the terminal holding block 42 of the fuse module 40. Furthermore, as shown in FIG. 10, the lateral support rib 64a on the terminal holding block 42 is disposed on one side of the first input terminal 90 in the width direction (vertical direction in FIG. 10), and the lateral support rib 64b on the side wall 110 is on the other side. Thus, the first input terminal 90 is sandwiched by the lateral support ribs 64a and 64b from both sides in the width direction thereof.

As shown in FIG. 9, the opening window 126 of the side wall 110 is close to the surface (upper face in FIG. 9) of the printed circuit board 16, and is on extensions of the respective lines on which the soldering portions 84 of the board terminals 48a to 48c and the busbars 50b to 50e in the fuse module 40, are arranged side by side in the arrangement direction (left-right direction in FIG. 9). It should be noted that the opening window 126 is configured to be covered by the peripheral wall 26 of the lower case 14 from the outer side.

Figure 3:
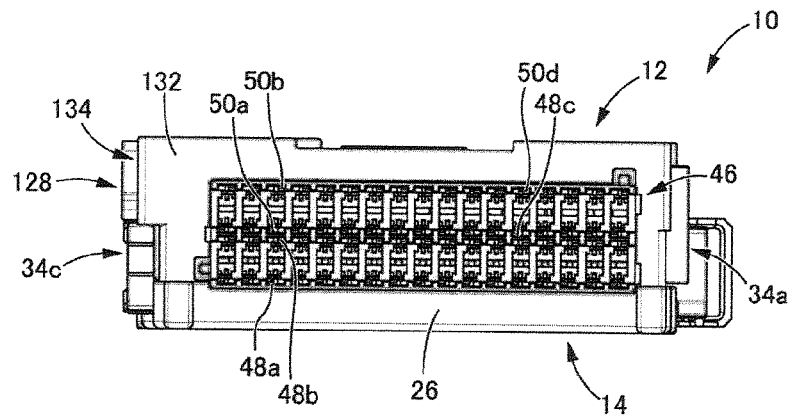
FIG. 3 is a side view of the electrical junction box shown in FIG. 1 as seen from a direction different from that of FIG. 2.

The printed circuit board 16 is accommodated between the upper and lower cases 12 and 14. In addition, as shown in FIG. 3, the fuse attachment portions 102 of the fuse module 40 open into a first side face 132 of the electrical junction box 10, and are arranged side by side in the direction in which the first side face 132 extends (left-right direction in FIG. 3) and in two tiers that are vertically one above the other. Moreover, as shown in FIG. 2, the first and second connector attachment portions 128 and 130 of the side wall 110 open into a second side face 134 of the electrical junction box 10 that is perpendicular to the first side face 132. Furthermore, as shown in FIG. 1, the connector 32 for external connection protrudes above the attachment surface 18 through the connector insertion hole 20 in the attachment surface 18.

The electrical junction box 10 is disposed, for example, in a compartment of an automobile. Then, a shaft in an external circuit member, such as an ECU (not shown) is supported by the bearings 22 of the upper case 12, and the external circuit member is rotated on the shaft and superposed on the attachment surface 18. Thus, a connector in the external circuit member is connected to the connector 32 for external connection that protrudes above the attachment surface 18 so that the printed circuit board 16 and the external circuit member are connected to each other. Moreover, connectors (not shown) are connected to the lateral connection type connectors 34a to 34c that open to the lateral sides of the electrical junction box 10.

Figure 11A:
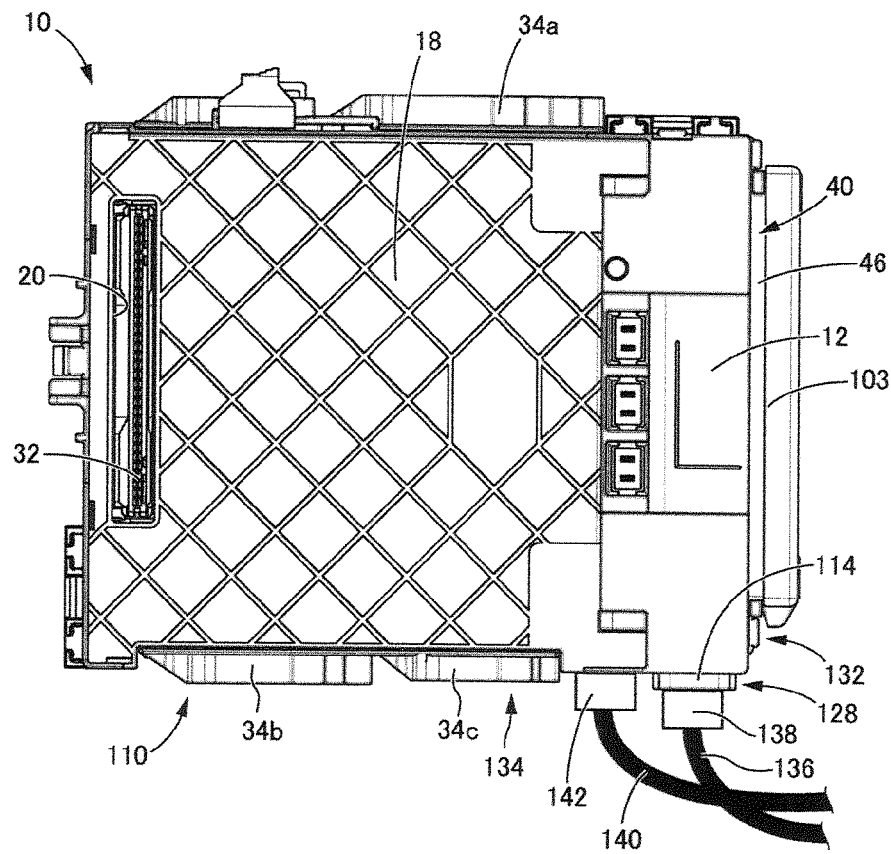
FIG. 11A is a plan view showing a state in which connectors are connected to the electrical junction box.
Figure 11B:
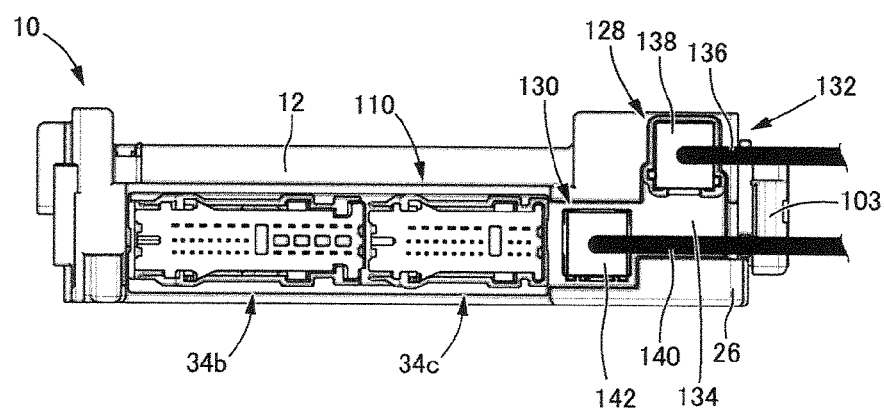
FIG. 11B is a side view showing the same state as in FIG. 11A.

Fuses (not shown) are connected respectively to the fuse attachment portions 102 that open into the first side face 132 of the electrical junction box 10. The fuses receive power supplied thereto via connectors connected respectively to the first and second connector attachment portions 128 and 130 that open into the second side face 134. More particularly, a connector 138 at an end of a wire 136 from a battery is connected to the first connector attachment portion 128 and a connector 142 at an end of a wire 140 from an alternator is connected to the second connector attachment portion 130, as shown in FIGS. 11A and 11B. The connector 138 is connected to the first input terminal 90 in the first connector attachment portion 128, and the connector 142 is connected to the second input terminal 96 in the second connector attachment portion 130, so that power is supplied to the fuse attachment portions 102 via the first and second input terminals 90 and 96.

The wires 136 and 140 extending from the respective connector attachment portions 128 and 130 may have to be bent due to a layout space or the like in a vehicle. However, the first and second connector attachment portions 128 and 130 are shifted vertically from each other so that overlapping of the two wires 136 and 140 and resulting interference between the wires 136 and 140 can be reduced. As a result, the bend radius of the wires 136 and 140 can be reduced even more, and the layout space of the electrical junction box 10 with the wires 136 and 140 taken into account can be reduced even more.

Figure 12A:
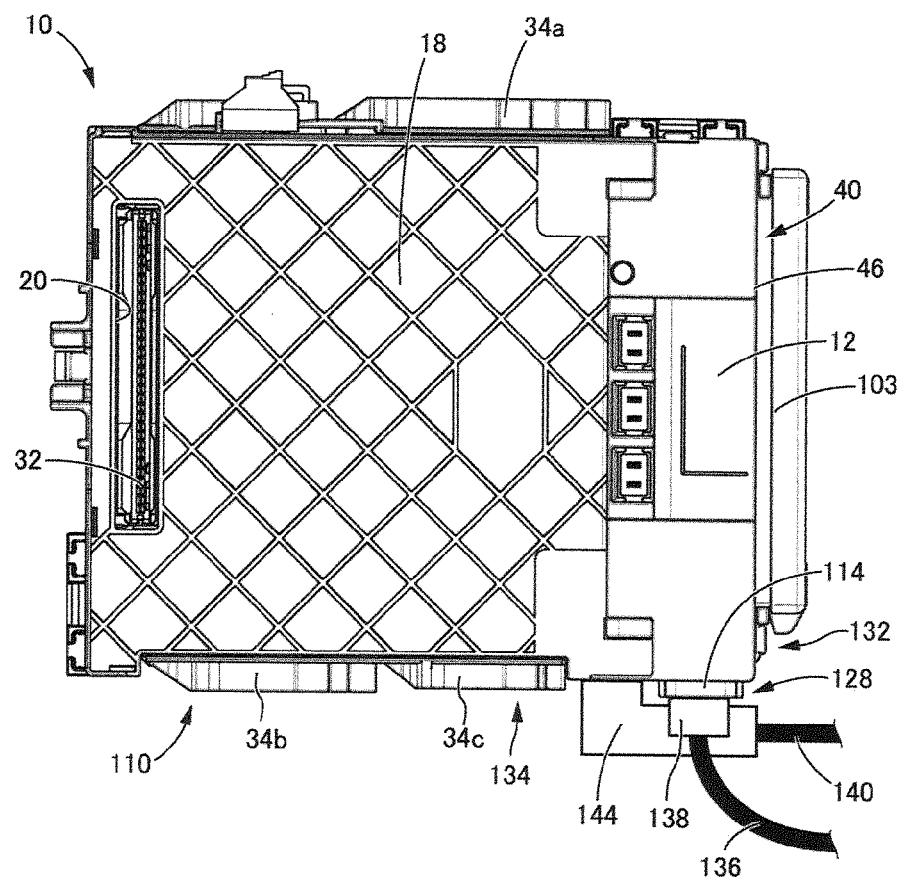
FIG. 12A is a plan view showing a state in which a different connector from the connector in FIGS. 11A and 11B is connected to the electrical junction box.
Figure 12B:
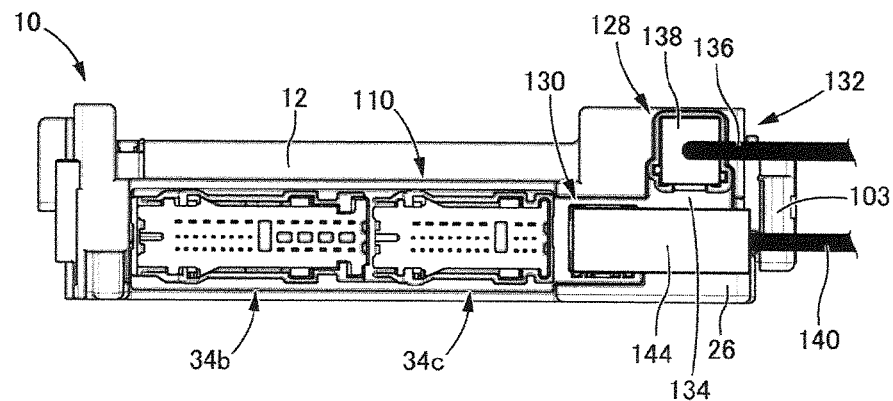
FIG. 12B is a side view showing the same state as in FIG. 12A.

The first and second connector attachment portions 128 and 130 also are shifted from each other laterally so that the second connector attachment portion 130 is more inward on the electrical junction box 10 in the direction in which the second side face 134 extends. Thus, a vacant space under the first connector attachment portion 128 can be used efficiently by connecting an L-shaped connector 144 to the second connector attachment portion 130, as shown in FIGS. 12A and 12B. The L-shaped connector 144 achieves high space efficiency so that the protruding length from the electrical junction box 10 is small. As a result, the wire 140 can be extended in a direction perpendicular to an opening direction (down in FIG. 12A) of the second connector attachment portion 130 without bending the wire 140, thereby achieving better space efficiency.

The first and second connector attachment portions 128 and 130 are shifted vertically shifted from each other by making use of the dimension of the fuse module 40 in the vertical direction. Specifically, the fuse attachment portions 102 are arranged in plural tiers. Accordingly, the first and second connector attachment portions 128 and 130 can be shifted vertically to achieve high space efficiency without increasing the vertical thickness (vertical direction in FIG. 12B) of the electrical junction box 10 beyond the vertical dimension of the fuse module 40.

The opening window 126 is formed under the first connector attachment portion 128 in the side wall 110, as shown in FIG. 9. Thus, the soldering portions 84 of the respective board terminals 48a to 48c in the fuse module 40 can be observed visually through the opening window 126, so that the soldered state of the board terminals 48a to 48c can be checked easily. Additionally, the opening window 126 is in a vacant space under the first connector attachment portion 128 that is closest to the fuse attachment portions 102 in the direction in which the second side face 134 extends. Thus, the opening window 126 is in a position on the extension lines of the respective lines on which the soldering portions 84 of the board terminals 48a to 48c are arranged, thereby facilitating visual observation with high space efficiency.

The support 68 on the side face 62 of the terminal holding block 42 is rearward of the upward extending portion 92 of the first input terminal 90, which is disposed within the first connector attachment portion 128. Thus, the first input terminal 90 is supported by the support 68 against a pushing force that is exerted during connection of the connector 138. Therefore, the connector can be connected stably to the first input terminal 90 despite the upward extending portion 92. In addition, the back face 124 of the side wall 110 is disposed forward of the upward extending portion 92 in the protruding direction of the first input terminal 90. Thus, the upward extending portion 92 is supported by the back face 124 when the connector 138 is removed from the first input terminal 90.

As shown in FIG. 10, the first input terminal 90 is sandwiched by the lateral support rib 64a on the terminal holding block 42 and the lateral support rib 64b on the side wall 110 from both sides in the width direction (vertical direction in FIG. 10). Thus, the first input terminal 90 is positioned accurately from both sides in the width direction within the first connector accommodating portion 114, and displacement of the first input terminal 90 during removal of the connector 138 can be reduced. In particular, one lateral support rib 64a is provided on the terminal holding block 42 and the other lateral support rib 64b is provided on the side wall 110. The first input terminal 90 is inserted into and mounted to the terminal holding block 42 from the rear side (upper side in FIG. 10). Thus, the lateral support rib 64b can be disposed on the rear side of the first input terminal 90 in the insertion direction (from the upper side to the lower side in FIG. 10).

Although an embodiment of the invention has been described in detail above, the invention is not limited to the specific descriptions thereof. For example, there is no limitation on the number of connector attachment portions and the number of tiers of fuse attachment portions in the fuse module. Three or more connector attachment portions may be shifted vertically from one another, or the fuse attachment portions may also be provided in three or more vertically displaced tiers in the fuse module.

The invention is not limited to the plurality of connector attachment portions that are shifted both laterally and vertically, and the connector attachment portions may partially overlap vertically or laterally. Furthermore, the connector attachment portions may be in the same position in the direction in which the second side face extends and in shifted positions only in the direction in which the tiers of the fuse attachment portions are placed one above another.

Furthermore, the invention is not limited to an electrical junction box to which a separate circuit member, such as an ECU unit, is connected as in the above-described embodiment. It is also possible to apply the invention to, for example, an electrical junction box in which an attachment portion for an electrical component such as a relay or a connector is provided on the upper face.

What is claimed is:

1. An electrical junction box comprising:
a fuse module with a terminal holding block and a plurality of fuse attachment portions that open into a first side face of a box body, the fuse attachment portions being arranged side by side in a plurality of tiers that are placed one above another; and
at least first and second connector attachment portions that open into a second side face of the box body that is perpendicular to the first side face, and first and second input terminals of the fuse module respectively projecting at least partly into the first and second connector attachment portions, the connector attachment portions being shifted from one another in a direction in which the tiers of the plurality of fuse attachment portions are placed one above another.

2. The electrical junction box of claim 1, wherein the connector attachment portions further are shifted from one another in a direction in which the second side face extends.

3. The electrical junction box of claim 2, further comprising an L-shaped connector connected to at least that connector attachment portion of the connector attachment portions that is located on an innermost side of the box body in the direction in which the second side face extends.

4. The electrical junction box of claim 2, further comprising an opening window formed under the connector attachment portion that is disposed on an upper side in the direction in which the tiers of the fuse attachment portions are placed one above another.

5. The electrical junction box of claim 1, further comprising a wall attached to the second side face of the box body, the first and second connector attachment portions being unitary with the wall.

6. The electrical junction box of claim 5, wherein the first input terminal has a bent portion sandwiched between the wall and the fuse module.

7. The electrical junction box of claim 6, further comprising first and second lateral support ribs supporting opposite sides of the bent portion of the first input terminal from opposite sides in the direction in which the second side face extends.

8. The electrical junction box of claim 7, wherein the first lateral support rib is unitary with the terminal holding block of the fuse module and the second lateral support rib is unitary with the wall.

\* \* \* \* \*